US006191770B1

(12) United States Patent
Kim

(10) Patent No.: US 6,191,770 B1
(45) Date of Patent: Feb. 20, 2001

(54) APPARATUS AND METHOD FOR TESTING DRIVING CIRCUIT IN LIQUID CRYSTAL DISPLAY

(75) Inventor: Seong Gyun Kim, Seoul (KR)

(73) Assignee: LG. Philips LCD Co., Ltd., Seoul (KR)

( * ) Notice: Under 35 U.S.C. 154(b), the term of this patent shall be extended for 0 days.

(21) Appl. No.: 09/169,357

(22) Filed: Oct. 9, 1998

(30) Foreign Application Priority Data

Dec. 11, 1997 (KR) .................................................. 97-67613

(51) Int. Cl.[7] ............................. G09G 3/36; G01R 31/00
(52) U.S. Cl. ............................................ 345/100; 324/770
(58) Field of Search ................................ 345/87, 98, 99, 345/100, 904, 93; 348/180; 702/118, 117; 324/770; 349/54, 55, 192

(56) References Cited

U.S. PATENT DOCUMENTS 5,063,378 * 11/1991 Roach .................................. 324/770
5,113,134 * 5/1992 Plus et al. ............................ 324/770
5,459,410 * 10/1995 Henley ................................. 324/770
5,465,053 * 11/1995 Edwards .............................. 324/770
5,506,516 * 4/1996 Yamashita et al. .................. 324/770
5,576,730 * 11/1996 Shimada et al. ...................... 345/98
5,644,331 * 7/1997 Hazama ................................. 345/99
5,734,450 * 3/1998 Irie et al. ............................ 324/770
5,774,100 * 6/1998 Aoki et al. ............................. 345/87
5,786,707 * 7/1998 Hayama et al. ..................... 324/770
6,023,260 * 2/2000 Higashi ............................... 345/100
6,064,222 * 5/2000 Morita et al. ....................... 324/770
6,100,865 * 8/2000 Sasaki .................................... 345/92

* cited by examiner

*Primary Examiner*—Steven J. Saras
*Assistant Examiner*—Paul A. Bell
(74) *Attorney, Agent, or Firm*—Long Aldridge & Norman LLP

(57) ABSTRACT

A driving circuit testing method that can quickly perform a test of a driving circuit in a liquid crystal display and a repair of defects thereof. In the method, a test signal is applied in parallel to all a plurality of gate lines and a start signal is applied to a first gate driving cell. The start signal and the test signals on a plurality of gate lines is latched into the plurality of gate driving cells. Signals latched into the plurality of gate driving cells, instead of the test signal being applied to the plurality of gate lines, are applied to the plurality of gate lines. Then, an enable state in each gate line is detected.

28 Claims, 4 Drawing Sheets

APPARATUS AND METHOD FOR TESTING DRIVING CIRCUIT IN LIQUID CRYSTAL DISPLAY

BACKGROUND OF THE INVENTION

1. Field of the Invention

This invention relates to a liquid crystal display for displaying a picture on a liquid crystal panel, and more particularly to a method and apparatus for testing a liquid crystal panel driving circuit. Also, this invention is directed to a testing circuit for testing a pixel matrix driving circuit.

2. Description of the Prior Art

Generally, a liquid crystal display apparatus displays a picture corresponding to video signals, such as television signals, on picture element (or pixel) matrices having pixels arranged in each intersection of gate lines and data lines. Each pixel consists of a liquid crystal cell for controlling a quantity of transmitted light in accordance with a voltage level of a data signal from the data line, and further consists of a thin film transistor(TFT) for switching the data signal to be transferred from the data line to the liquid crystal cell in response to a scan signal from the gate line. In order to drive the pixels, the liquid crystal display apparatus includes a data driving circuit for applying a data signal to each data line, and a gate driving circuit for applying a scan signal to the gate lines sequentially. These data driving circuit and gate driving circuit may have defects due to an error in the fabricating process. Typically, the liquid crystal display apparatus is provided with a redundant driving circuit used as a backup to a defective driving circuit.

For example, as shown in FIG. 1, the liquid crystal display apparatus provided with the redundant driving circuit includes a data driving circuit 4 connected to the data lines of a pixel matrix 2, a gate driving circuit 6 connected to the left terminals of the gate lines and a redundant gate driving circuit 8 that can be serially connected to the right terminals of the gate lines. The gate driving circuit 6 includes 1st to nth gate driving cells GD1 to GDn that are connected to a start signal line SSL in series and to each of n gate lines. The first gate driving cell GD1 includes a shift register 10 and a buffer 12 which are serially connected between the start signal line SSL and the left terminal of the first gate line GL1, and the respective second to nth gate driving cells GD2 to GDn include a shift register 10 and a buffer 12 that are serially connected between two adjacent gate lines.

The gate driving cells GD1 to GDn are sequentially enabled as a start voltage signal Vst from the start signal line is shifted, thus, sequentially driving the gate lines GL1 to GLn. For example, the kth gate driving cell GDk drives the kth gate line GLk when a start voltage signal is applied from the (k-1)th gate driving cell. Likewise, the redundant gate driving circuit 8 includes 1st to nth redundant gate driving cells RGD1 to RGDn that are serially connected to the start signal line SSL and, at the same time, connected to each of the n gate lines. The first redundant gate driving cell GD1 includes a shift register 10 and a buffer 12 which can be serially connected between the start signal line SSL and the right terminal of the first gate line GL1. The respective 2nd to nth redundant gate driving cells RGD2 to RGDn include a shift register 10 and a buffer 12 that can be serially connected between two adjacent gate lines. The redundant gate driving cells RGD1 to RGDn drive the gate lines connected to the output terminals thereof when the start voltage signal Vst is shifted from the adjacent preceding gate lines. At this time, the first redundant gate driving cell RGD1 receives the start voltage signal Vst from the start signal line SSL. For example, when the kth gate driving cell GDk has defects, the kth redundant gate driving cell RGDk is connected between the (k-1)th gate line GLk-1 and the kth date line GLk by a manufacturer during fabrication, thereby driving the kth gate line GLk when the start signal Vst is input from the (k-1)th gate line GLk.

The test of such liquid crystal display apparatus should not only be repeatedly performed depending on the number of defective gate driving cells, but also should be alternated with the repair of gate driving cells having defects. For example, in the liquid crystal display apparatus described above and shown in FIG. 1, the test should be repeated at least three times when the third and (n-2)th gate driving cells GD3 and GDn-2 have defects. At the time of the first test, only the first and second gate lines GL1 and GL2 driven with the first and second gate driving cells GD1 and GD2 appear to be normal; while all of the third to nth gate lines GD3 to GDn appear to be abnormal because of the defect in the third driving cell GD3. In other words, the 4th to nth gate lines GD4 to GDn cannot be tested due to the defect in the third gate driving cell GD3. The second test is performed after the third redundant gate driving cell RGD3, instead of the third gate driving cell GD3, is set to the driving mode by the repair work of a manufacturer. At the time of the second test, the first to (n-3)th gate lines GLl to GLn-3 appear to be normal; while the (n-2)th to nth gate lines GLn-2 to GLn appear to be abnormal. In other words, the (n-1)th and nth gate lines GLn-1 and GLn cannot be tested because the (n-2)th gate driving cell GDn-2 is not operating properly. The abnormality of these (n-1)th and nth gate lines GLn-1 and GLn can be detected through the third test. The third test is carried out after the second repair work, in which the (n-2)th redundant gate driving cell RGDn-2 instead of the (n-2)th gate driving cell GDn-2 is set to the driving mode, has been terminated. In the third test, all the first to nth gate lines GL1 to GLn appear to be normal.

As described above, the conventional liquid crystal display apparatus provided with the redundant driving circuit was configured in such a manner that it was difficult to fully detect defects in the driving circuit with a single test. Because of this disadvantage in the conventional liquid crystal display apparatus provided with the redundant driving circuit, the testing and repairing work must be repeatedly performed depending on the number of defects in order to fully repair defects involved in the driving circuit. As a result, the conventional liquid crystal apparatus provided with the redundant driving circuit required a considerable time for testing and repairing. Also, the conventional liquid crystal display apparatus provided with the redundant driving circuit is problematic to a manufacturer because of the repeated testing and repairing depending on the number of defects.

SUMMARY OF THE INVENTION

Accordingly, it is an object of the present invention to provide a method and apparatus for testing a driving circuit that is capable of performing a test of the driving circuit and a repair of defects in the driving circuit in a liquid crystal display.

In order to achieve this and other objects of the invention, a driving circuit testing method according to one aspect of the present invention includes a first step of applying a test signal to all the gate lines in parallel; a second step of applying the start signal to a first gate driving cell in the plurality of gate driving cells; a third step of allowing the signals to be latched into each gate driving cell; a fourth step of replacing the test signal being applied to the plurality of gate lines with the signals latched into the plurality of gate driving cells; and a fifth step of testing an enable state in each gate line.

A driving circuit testing method according to another aspect of the present invention includes a first step of applying a test signal to all the gate lines in parallel; a second step of applying the start signal to a first gate driving cell in the plurality of gate driving cells; a third step of allowing the signals to be latched into any ones of odd-numbered and even-numbered gate driving cells in the plurality of gate driving cells; a fourth step of replacing the signals latched into any ones of the odd-numbered and even-numbered gate driving cells with the testing signal; and a fifth step of testing an enable state in each gate line connected to any ones of the odd-numbered and even-numbered gate driving cells.

A driving circuit testing apparatus to still another aspect of the present invention includes means for applying a test signal to all the gate lines in parallel; means for applying the start signal to a first gate driving cell in the plurality of gate driving cells; latching control means for allowing the signals to be latched into each gate driving cell; signal switching means for replacing the test signal being applied to the plurality of gate lines with the signals latched into the plurality of gate driving cells; and detecting means for detecting an enable state in each gate line.

A driving circuit testing apparatus to still another aspect of the present invention includes means for applying a test signal to all the gate lines in parallel; means for applying the start signal to a first gate driving cell in the plurality of gate driving cells; latching control means for allowing the signals to be latched into any ones of odd-numbered and even-numbered gate driving cells in the plurality of gate driving cells; signal switching means for replacing the signals latched into any ones of the odd-numbered and even-numbered gate driving cells with the testing signal; and detecting means for detecting an enable state in each gate line connected to any ones of the odd-numbered and even-numbered gate driving cells.

BRIEF DESCRIPTION OF THE DRAWINGS

These and other objects of the invention will be apparent from the following detailed description of the embodiments of the present invention with reference to the accompanying drawings.

DETAILED DESCRIPTION OF THE PREFERRED EMBODIMENT

Figure 1:
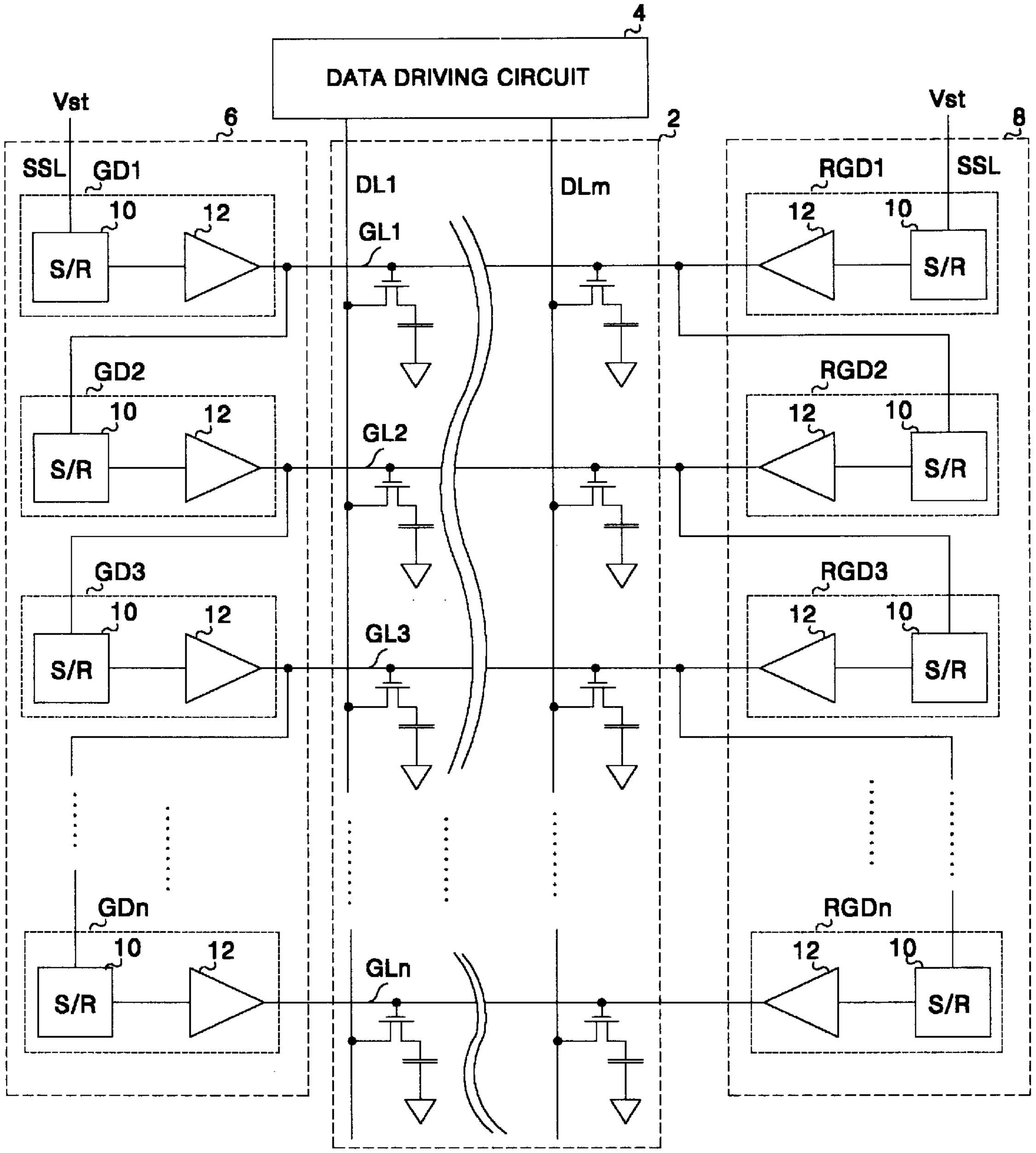
FIG. 1 PRIOR ART
FIG. 1 is a schematic view of a conventional liquid crystal display apparatus.
Figure 2:
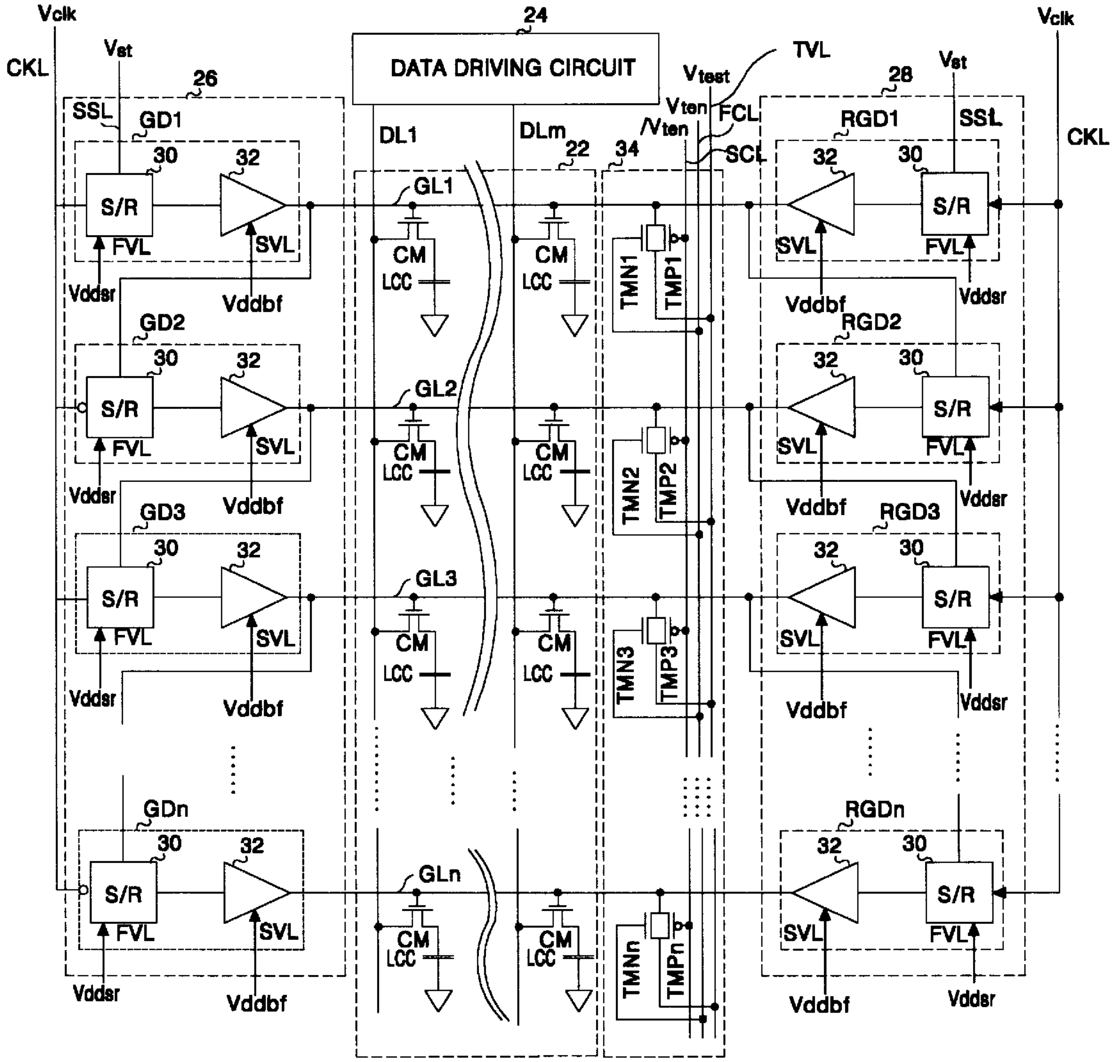
FIG. 2 is a schematic view of a liquid crystal display apparatus employing a driving circuit testing apparatus according to a preferred embodiment of the present invention.

Referring to FIG. 2, there is shown a liquid crystal display employing a driving circuit testing apparatus according to a preferred embodiment of the present invention. As shown in FIG. 2, the liquid crystal display includes a data driving circuit 24 connected to data lines DL1 to DLn of a pixel matrix 22, a gate driving circuit 26 connected to the left terminals of gate lines GL1 to GLn, and a redundant gate driving circuit 28 connected to the right terminals of the gate lines GL1 to GLn. A TFT cell CM and a liquid crystal cell are arranged in each intersection point in which the data lines DL1 to DLn are intersected with the gate lines GL1 to GLn. Each liquid crystal cell LCC displays a picture by controlling the light transmissivity in accordance with a voltage level of a data signal from the data line DL. Each TFT cell CM switches the data signal to be transferred from the data line DL to the liquid crystal cell LCC in response to a signal from the gate line GL. The data driving circuit 24 applies a data signal to each data line DL1 to DLm in every horizontal period.

The gate driving circuit 26 includes 1st to nth gate driving cells GD1 to GDn that are connected to a start signal line SSL in series and to each of the n gate lines GL1 to GLn. The first gate driving cell GD1 includes a shift register 30 and a buffer 32 which are serially connected between the start line SSL and the first gate line GL1. The respective second and nth gate driving cells GD2 and GDn each includes a shift register 30 and a buffer 32 which are connected in series between two adjacent gate lines.

The gate driving cells GD1 to GDn are sequentially enabled as a start voltage signal Vst from the start signal line SSL is shifted, thus sequentially driving the n gate lines GL1 to GLn. For example, the kth gate driving cells GDk drives the kth gate line GLk when the start voltage signal is applied from (k-1)th gate driving cell GDk-1. To this end, the shift register 30 included in each odd-numbered gate driving cell GD1, GD3, , GDn-1 or GDn latches a signal from the start line SSL or the adjacent upper gate line GL2, GL4, . . . , GLn-2 or GLn-1, respectively, in the rising edge of a clock signal Vclk from a clock line CKL.

On the other hand, the shift register 30 included in each even-numbered gate driving cell GD2, GD4, . . . , GDn-1 or GDn latches a signal from the start line SSL or the adjacent upper gate line GL1, GL3, . . . , GLn-2 or GLn-1, respectively, in the falling edge of a clock signal Vclk from a clock line CKL. Further, each shift resister 30 is driven during an interval when a shift register drive voltage Vddsr is applied.

In order to sequentially shift the start signal Vst along the shift registers 30 included in the gate driving cells GD1 to GDn, the clock signal Vclk changes from a high logic to a low logic or vice versa in every horizontal scanning interval. The buffer 32 included in each gate driving cell GD1 to GDn provides buffered signals from the shift register 30 to the gate line GL. The buffer 30 included in each gate driving cells GD1 to GDn performs such a buffering operation during an interval when a buffer driving voltage Vddbf is applied from the second driving voltage line SVL.

The redundant gate driving circuit 28 includes 1st to nth redundant gate driving cells RGD1 to RGDn that are serially connected to the start signal line SSL and, at the same time, connected to each of the n gate lines. The first redundant gate driving cell GD1 includes a shift register 30 and a buffer 32 which are serially connected between the start signal line SSL and the right terminal of the first gate line GL1, and the respective 2nd to nth redundant gate driving cells RGD2 to RGDn include a shift register 30 and a buffer 32 that are serially connected between two adjacent gate lines. Each one of the redundant gate driving cells RGD1 to RGD2 is connected between two gate lines GD, instead of to the gate driving cells having defects when the gate driving cells GD1 to GDn corresponding to themselves have defects. Further, each redundant gate driving cell RGD1 to RGDn drives a gate line connected to the output terminal thereof in accordance with a voltage signal at the adjacent preceding gate line.

At this time, the first redundant gate driving cell RGD1 receives the start voltage signal Vst from the start signal line SSL. For example, when the kth gate driving cell GDk has defects, the kth redundant gate driving cell RGDk is connected between the (k-1)th gate line GLk-1 and the kth date line GLk by a manufacturer, hence driving the kth gate line GLk when the start signal Vst is input from the (k-1)th gate line GLk. The shift registers 30 and the buffers 32 included in each redundant gate driving cell RGD1 to RGDn are driven with the shift register driving voltage Vddsr from the first driving voltage line FVL and the buffer driving voltage Vddbf from the second driving voltage line SVL.

The liquid crystal display apparatus of the present invention includes a test voltage source 34 connected to the right terminals of the gate lines GD1 to GDn. This test voltage source 34 switches a test voltage Vtest to be delivered from a test voltage line TVL to the gate lines GD1 to GDn in response to the first and second test control signals Vten and /Vten from the first and second control lines FCL and SCL. To this end, the test voltage source 34 includes n NMOS TFTs TMN1 to TMNn connected to the test voltage line TVL and to each gate line GL1 to GLn, and n PMOS TFTs TMP1 to TMPn connected in parallel to each NMOS TFTs TMN1 to TMNn. The n NMOS TFTs TMN1 to TMNn are simultaneously turned on during an interval when a high logic of first control signal Vten is applied from the first control line FCL, thereby transferring the test voltage Vten from the test voltage line TVL to the n gate lines GL1 to GLn. The first control signal Vten remains at a high logic during a certain interval when the liquid crystal display apparatus is tested.

The n PMOS TFTs TMP1 to TMPn are preferably simultaneously turned on during an interval when the second control signal /Vten from the second control line SCL remains at a low logic, thereby transferring the test voltage Vtest from the test voltage line TVL to the gate line GL. The second control signal /Vten has a waveform opposite to the first control signal Vten. In other words, the n PMOS TFTs TMP1 to TMPn are turned on simultaneously with the n NMOS TFTs TMN1 to TMNn to increase a current amount supplied to each gate line GL1 to GLn. As a result, even though a number of gate driving cells in the gate driving cells GD1 to GDn have defects, an abnormality of the gate driving cells GD1 to GDn can be simultaneously detected. In other words, the test of driving circuit is completed in a single test procedure.

The test of driving circuit is preferably divided into an odd mode for detecting the abnormality of each odd-numbered gate driving cell GD1, GD3, . . . , GDn-1 and an even mode for detecting the abnormality of each even-numbered gate driving cell GD2, GD4, . . . , GDn. This is caused by a fact that the shift registers 30 included in each odd-numbered gate driving cell GD1, GD3, . . . , GDn-1 performs a latching operation in a rising edge of the clock signal while the shift registers 30 included in each even-numbered gate driving cell GD2, GD4, . . . , GDn performs a latching operation in a falling edge of the clock signal.

When all of the n gate driving cells GD1 to GDn include the shift registers 30 performing the latching operation in any one of the rising edge and the falling edge, the abnormality of the n gate driving cells GD1 to GDn are simultaneously detected. Further, n shift registers 30 commonly connected to the first driving voltage line FVL is driven earlier than the n buffers 32 commonly connected to the second driving voltage line SVL by means of the shift register driving voltage Vddsr supplied earlier than the buffer driving voltage Vddbf at the time of testing. The n buffers 32 are driven with the buffer driving voltage Vddbf from the second driving voltage line SVL after the n NMOS TFTs TMN1 to TMNn and the n PMOS TFTs TMP1 to TMPn were turned off. At this time, all the n gate lines GL1 to GLn are enabled by means of output signals of the n shift registers 30 buffered with each of the n buffers 32. However, the gate lines GL connected to the gate driving cells GD having defects in any one of the shift register 30 and the buffer 32 are disabled. The gate driving cells GD having defects can be simultaneously detected through such a testing process. Also, all of the gate driving cells GD having defects can be replaced at the same time with the redundant gate driving cells RGD during a repair process. The test voltage line TVL included in the test voltage source 34 serves to transfer the test voltage Vtest from the test power supply, not shown, to the gate lines GLl to GLn at the time of testing the driving circuit; while serving to prevent a static electricity by connecting the gate lines GL1 to GLn to the ground GND, not shown, in the other case.

Figure 3:
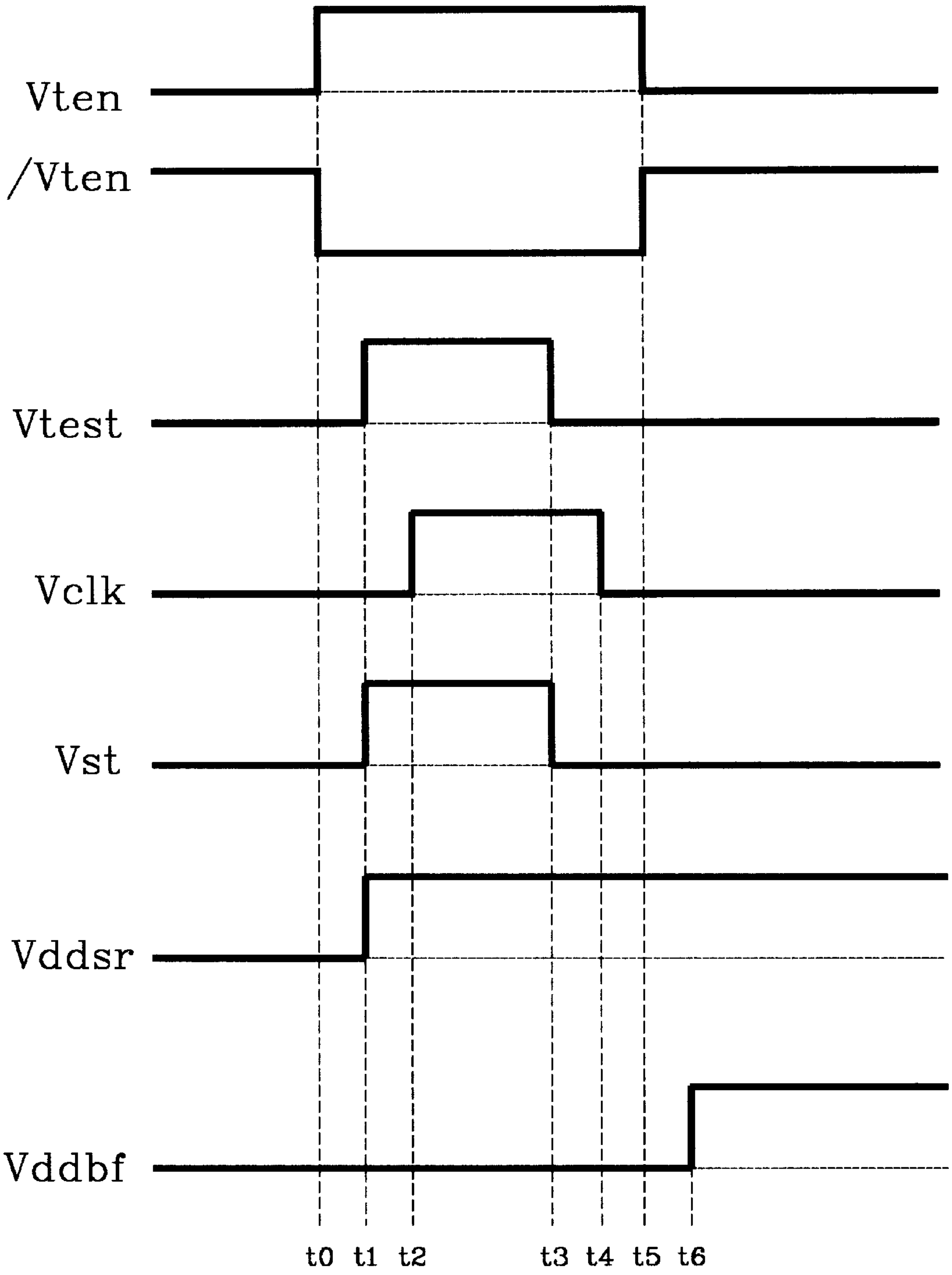
FIG. 3 is an operational waveform diagram of each part of the circuits shown in FIG. 2 when the odd-numbered gate driving cells are tested.

FIG. 3 is a timing chart of signals applied to each part of the liquid crystal display apparatus in FIG. 2 when the odd-numbered gate driving cells GD1, GD3, GDn-1 are being tested. At tO the first control signal Vten applied to the gate of NMOS TFTs TMN1 to TMNn changes from a low logic into a high logic while the second control signal /Vten changes from a high logic into a low logic. Accordingly, all of the NMOs TFTs TMN1 to TMNn and the PMOS TFTs TMP1 to TMPn are turned on to thereby connect n gate lines GL1 to GLn to the test voltage line TVL. Next, at t1 a test voltage Vtest is applied to the test voltage line TVL, a start signal Vst to the start signal line SSL, and a shift register driving voltage Vddsr to n shift registers 30 included in the n gate driving cells GD1 to GDn. The n shift registers 30 included in the first to nth gate driving cells GD1 to GDn enter the driving mode. Also, the test voltage Vtest on the test voltage line TVL is applied, via the n NMOS TFTs TMN1 to TMNn and the n PMOS TFTs TMP1 to TMPn, to n gate lines GL1 to GLn. Accordingly, the start signal Vst is applied to the shift register 30 in the first gate driving cell GD1, and the test voltage Vtest on the test voltage line TVL is applied, via (n-1) gate lines GL1 to GLn-1, to (n-1) shift registers 30 included in each of the second to nth gate driving cells GD2 to GDn. A clock signal Vclk applied to the clock line CLK changes from a low logic into a high logic at t2. The odd-numbered gate driving cells GD1, GD3, . . . , GDn-1 latch the start signal Vst or the test voltage Vtest into the buffers 32 using the clock signal Vclk.

At t3, the start signal Vst transits to a low logic and the test voltage Vtest on the test voltage line TVL is turned off. At t4, the clock signal Vclk on the clock line CKL transits to a low logic. At t5, the first control signal Vten transits from a high logic to a low logic while the second control signal /Vten changes from a low logic into a high logic. A buffer driving voltage Vddbf is then applied, via the second driving voltage line SVL, to the buffers 32 included in each gate driving cell GD1 to GDn. At this time, all the buffers 32 included in each gate driving cell GD1 to GDn enter the driving mode. The buffers 32 included in the odd-numbered gate driving cells GD1, GD3, . . . , GDn-1 charge the output signals of the shift registers 32 latching the start signal Vst or the test voltage Vtest to the odd-numbered gate lines GL1, GL3, . . . , GLn-1. As a result, the pixels connected to the odd-numbered gate lines GL1, GL3, . . . , GLn-1 are driven. At this time, a tester probes the voltage levels on the odd-numbered gate lines GL1, GL3, . . . , GLn-1 thereby detecting, if any, an abnormality of each odd-numbered gate driving cell GD1, GD3, . . . , GDn-1. Alternatively, a tester may detect an abnormality of each odd-numbered gate driving cell GD1, GD3, . . . , GDn-1 using a non-probing method, such as an electro-optical method.

Figure 4:
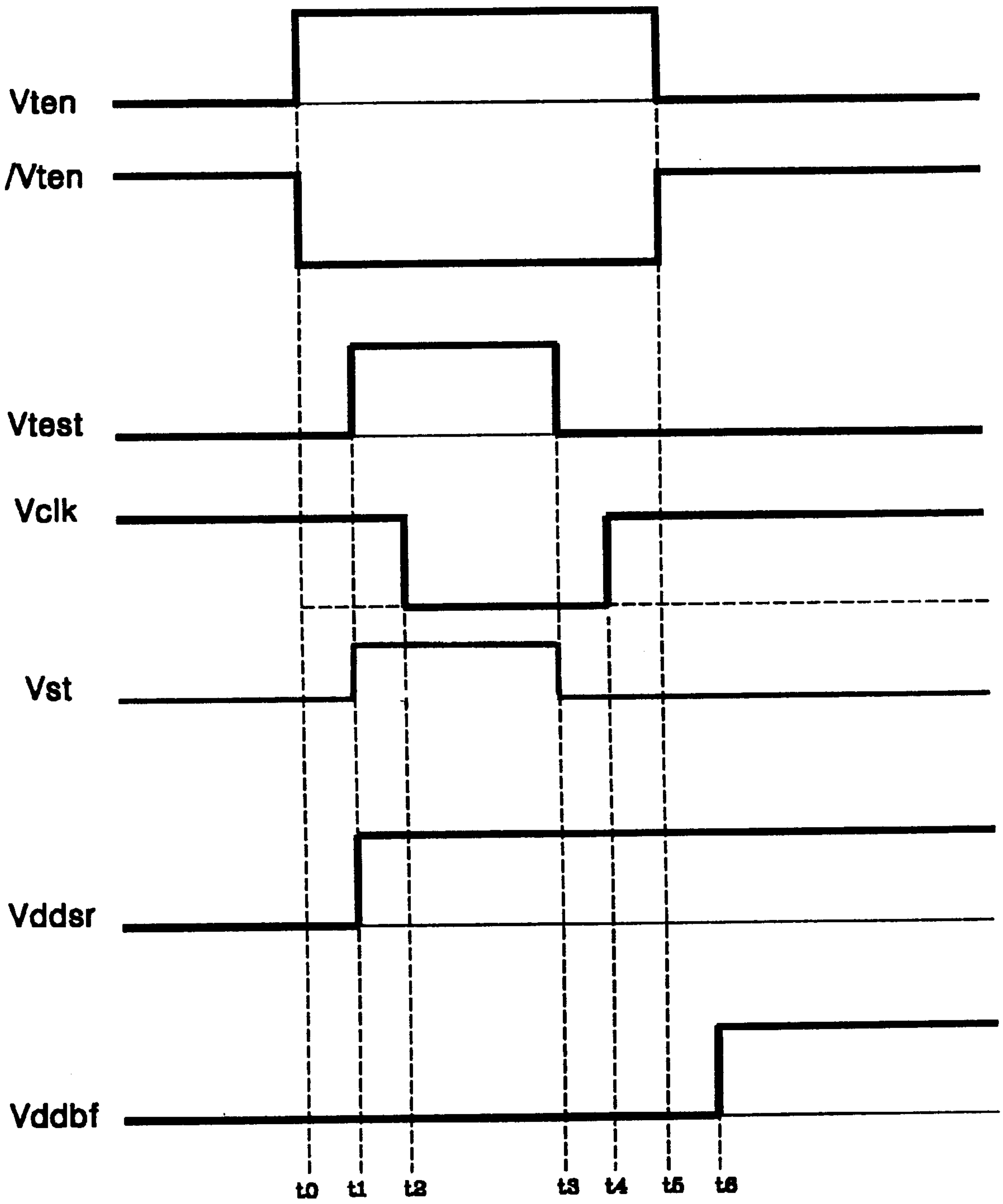
FIG. 4 is an operational waveform diagram of each part of the circuits shown in FIG. 2 when the even-numbered gate driving cells are tested.

FIG. 4 is a timing chart of signals applied to each part of the liquid crystal display apparatus in FIG. 2 when even-numbered gate driving cells GD2, GD4, . . . , GDn are being tested. At to, the first control signal Vten applied to the gates of NMOS TFTs TMN1 to TMNn changes from a low logic into a high logic while the second control signal /Vten changes from a high logic into a low logic. Accordingly, all of the NMOs TFTs TMN1 to TMNn and the PMOS TFTs TMP1 to TMPn are turned on to thereby connect n gate lines GL1 to GLn to the test voltage line TVL. Next, at t1, a test voltage Vtest is applied to the test voltage line TVL, a start signal Vst is applied to the start signal line SSL, and a shift register driving voltage Vddsr is applied to n shift registers 30 included in the n gate driving cells GD1 to GDn. The n shift registers 30 included in the first to nth gate driving cells GD1 to GDn enter the driving mode. Also, the test voltage Vtest on the test voltage line TVL is applied, via the n NMOS TFTs TMN1 to TMNn and the n PMOS TFTs TMP1 to TMPn, to n gate lines GL1 to GLn. Accordingly, the test voltage Vtest on the test voltage line TVL is applied, via (n-1) gate lines GL1 to GLn-1, to (n-1) shift registers 30 included in each of the second to nth gate driving cells GD2 to GDn. A clock signal Vclk applied to the clock line CLK changes from a high logic into a low logic at t2. The even-numbered gate driving cells GD2, GD4, . . . , GDn latch the test voltage Vtest into the buffers 32 using the clock signal Vclk.

At t3, the test voltage Vtest on the test voltage line TVL is turned off. Further, at t4, the clock signal Vclk on the clock line CKL changes from a low logic into a high logic. At t5, the first control signal Vten transits from a high logic to a low logic while the second control signal /Vten changes from a low logic into a high logic.

A buffer driving voltage Vddbf is then applied, via the second driving voltage line SVL, to the buffers 32 included in each gate driving cell GD1 to GDn. At this time, all the buffers 32 included in each gate driving cell GD1 to GDn enter the driving mode. The buffers 32 included in the even-numbered gate driving cells GD2, GD4, . . . , GDn charge the output signals of the shift registers 32 latching the test voltage Vtest to the even-numbered gate lines GL2, GL4, . . . , GLn. As a result, the pixels connected to the even-numbered gate lines GL2, GL4, . . . , GLn are driven. At this time, a tester probes voltage levels on the even-numbered gate lines GL2, GL4, . . . , GLn, thereby detecting an abnormality of each odd-numbered gate driving cell GD2, GD4, . . . , GDn. The abnormality of each gate driving cells can be simultaneously detected using the testing process as described. Accordingly, the testing time of driving circuit is reduced.

The gate driving cells GD detected to be abnormal through such a testing process can be repaired at the same time with the redundant gate driving cells RGD. For example, as a result of testing, when the second and (n-1)th gate driving cells GD2 and GDn-1 are detected to be abnormal, the second redundant gate driving cell RGD2 instead of the second gate driving cell GD2 is connected between the first gate line GL1 and the second gate line GL2. In addition, the (n-1)th redundant gate driving cell RGDn-1 instead of the (n-1)th gate driving cell GDn-1 is connected between the (n-2)th gate line GLn-2 and the (n-1)th gate line GLn-1, thereby, substantially concurrently repairing the second and (n-1)th gate driving cells GD2 and GDn-1. Accordingly, a time required for the repairing work is substantially reduced.

As described above, in the testing method and apparatus of the driving circuit according to the present invention, the gate driving cells are driven in such a manner that all or substantial part of the gate lines are simultaneously enabled by the gate driving cells, thereby simultaneously detecting an abnormality of each gate driving cell. As a result, the testing method and apparatus of driving circuit according to the present invention is capable of reducing the testing time dramatically as well as reducing the repair time. Further, the testing method and apparatus of driving circuit according to the present invention can eliminate any difficulties incurred to a testing worker and a repairing worker.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method for testing a driving circuit of a liquid crystal display having a plurality of gate driving cells connected to a plurality of corresponding gate lines and connected in series to a start signal line, the steps comprising:

applying a test signal to the plurality of gate lines;

applying a start signal to a first gate driving cell in the plurality of gate driving cells;

latching the test signal to each gate driving cell;

replacing the test signal being applied to the plurality of gate lines with the test signals latched into the plurality of gate driving cells; and testing a signal state of each gate line.

2. The method as claimed in claim 1, wherein the replacing the test signal further includes turning off of the test signal applied to the plurality of gate lines and then latching the test signal to the plurality of gate driving cells to be applied to the plurality of gate lines.

3. The method as claimed in claim 1, wherein the step of testing the signal state detects voltage levels on the plurality of gate lines using a probe.

4. The method as claimed in claim 1, wherein the step of testing the signal state includes an electro-optical testing method.

5. A method for testing a driving circuit of a liquid crystal display having a plurality of gate driving cells connected to a plurality of gate lines and connected in series to a start signal line, the steps comprising:

first step of applying a test signal to the plurality of gate lines in parallel;

second step of applying a start signal to a first gate driving cell in the plurality of gate driving cells;

third step of latching the test signals to any one of odd-numbered and even-numbered gate driving cells in the plurality of gate driving cells;

fourth step of replacing the signals latched into any one of the odd-numbered and even-numbered gate driving cells with the testing signal; and fifth step of testing an enable state in each gate line connected to any one of the odd-numbered and even-numbered gate driving cells.

6. The method as claimed in claim 5, wherein the third step latches the test signals into any one of the odd-numbered and even-numbered gate driving cells in response to a clock signal.

7. The method as claimed in claim 5, wherein the fourth step turns off the test signal applied to the plurality of gate lines and then latches the test signals to any one of the odd-numbered and even-numbered gate driving cells to be applied to the plurality of gate lines.

8. The method as claimed in claim 5, wherein the fifth step includes examining of a voltage level in any one of the odd-numbered and even-numbered gate lines using a probe.

9. The method as claimed in claim 5, wherein the fifth step tests the enable state in each gate line of any one of the odd-numbered and even-numbered gate lines using an electro-optical testing method.

10. A driving circuit testing apparatus for a liquid crystal display having a plurality of gate driving cells connected to a plurality of gate lines and connected in series to a start signal line, the driving circuit testing apparatus comprising:

means for applying a test signal to the plurality of gate lines;

latching control means for latching the test signal in the plurality of gate lines to each gate driving cell;

signal switching means for replacing the test signal being applied to the plurality of gate lines with the test signal latched in the plurality of gate driving cells; and detecting means for detecting an enable state in each gate line.

11. The driving circuit testing apparatus as claimed in claim 10, wherein the signal switching means turns off the test signal applied to the plurality of gate lines and then latches the test signal to the plurality of gate driving cells to be applied to the plurality of gate lines.

12. The driving circuit testing apparatus as claimed in claim 10, wherein the detecting means detects voltage levels in the plurality of gate lines using a probe to test the enable state in each gate line.

13. The driving circuit testing apparatus as claimed in claim 10, wherein the detecting means tests the enable state in each gate line using an electro-optical testing method.

14. A driving circuit testing apparatus for a liquid crystal display having a plurality of gate driving cells connected to a plurality of gate lines and connected in series to a start signal line, the driving circuit testing apparatus comprising:

means for applying a test signal to the plurality of gate lines;

latching control means for allowing the signals on the gate lines to be latched into any one of odd-numbered and even-numbered gate driving cells in the plurality of gate driving cells;

signal switching means for replacing the test signal latched to any one of the odd-numbered and even-numbered gate driving cells with the testing signal; and detecting means for detecting an enable state in each gate line connected to any ones of the odd-numbered and even-numbered gate driving cells.

15. The driving circuit testing apparatus as claimed in claim 14, wherein the latching control means latches the test signal to any one of the odd-numbered and even-numbered gate driving cells in response to a clock signal.

16. The driving circuit testing apparatus as claimed in claim 14, wherein the signal switching means turns off the test signal applied to the plurality of gate lines and then latches the test signal to any one of the odd-numbered and even-numbered gate driving cells to be applied to the plurality of gate lines.

17. The driving circuit testing apparatus as claimed in claim 14, wherein the detecting means detects voltage levels on any one of the odd-numbered and even-numbered gate lines using a probe to test the enable state in each gate line.

18. The driving circuit testing apparatus as claimed in claim 14, wherein the detecting means tests the enable state in each gate line of any one of the odd-numbered and even-numbered gate lines using an electro-optical testing method.

19. A driving circuit tester for a liquid crystal display having a plurality of gate lines, the driving circuit test comprising:

a first set of gate line drivers in which each gate driver is detachably connected to a corresponding gate line, wherein an output of a preceding gate line driver is connected to an input of a succeeding gate line driver;

a second set of gate line drivers in which each gate driver is detachably connected to corresponding gate line, wherein an output of a preceding gate line driver is connected to an input of a succeeding gate line driver;

a test signal line connected to the plurality of gate lines to provide a test signal to the plurality of gate lines; and a driver controller connected to the first and the second sets of gate line drivers, wherein an input signal of the first and the second sets of gate line drivers is outputted as an output signal in response to a driver control signal from the latch controller.

20. A driving circuit tester of claim 19, wherein each gate line driver includes a latch and a buffer serially connected to the latch.

21. A driving circuit tester of claim 20, wherein the driver control signal includes a latch control signal for controlling the latch and a buffer control signal for controlling output of the buffer.

22. A driving circuit tester of claim 21, wherein the test signal is provided to the plurality of gate lines when the buffer control signal is at a first logic level and not provided when the buffer control signal is at a second logic level.

23. A driving circuit tester of claim 21, wherein when the test signal is enabled then the latch control signal is also enabled.

24. A driving circuit tester of claim 20, wherein the latch is a shift register.

25. A driving circuit tester of claim 19, further including a switch serially connected between each one of the plurality of gate lines and the test signal line to control the transfer of the test signal to the plurality of gate lines.

26. A driving circuit tester of claim 25, wherein the switch includes an n-type transistor and a p-type transistor connected in parallel to each other.

27. A driving circuit tester of claim 20, further including a clock signal having first and second logic levels and connected to the latch of the first and the second sets of gate line drivers, wherein the latch for even-numbered gate line drivers is triggered when the clock signal is at the first logic level and odd-numbered gate line drivers is triggered when the clock signal is at the second logic level.

28. A driving circuit tester of claim 19, further including a start signal applied to first gate line drivers of the first and the second sets of gate line drivers.

* * * * *